United States Patent
Damgaard et al.

(10) Patent No.: US 6,766,178 B1
(45) Date of Patent: Jul. 20, 2004

(54) RF ARCHITECTURE FOR CELLULAR MULTI-BAND TELEPHONES

(75) Inventors: Morten Damgaard, Laguna Hills, CA (US); Leo Li, Trabuco Canyon, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 09/386,257

(22) Filed: Aug. 31, 1999

Related U.S. Application Data

(63) Continuation-in-part of application No. 09/057,124, filed on Apr. 8, 1998, now Pat. No. 6,208,875.

(51) Int. Cl.$^7$ ............................. H04M 1/00; H04B 1/40
(52) U.S. Cl. ............................. 455/552.1; 455/553.1; 455/76; 455/86; 455/216
(58) Field of Search ............................. 455/552, 553, 455/76, 75, 86, 84, 189.1, 188.1, 168.1, 147, 208, 255, 318; 375/219, 200

(56) References Cited

U.S. PATENT DOCUMENTS

| | | | | |
|---|---|---|---|---|
| 2,447,392 A | * | 8/1948 | Byrne ........................ | 455/552 |
| 5,519,885 A | * | 5/1996 | Vaisanen .................... | 455/76 |
| 5,815,525 A | * | 9/1998 | Smith et al. ................ | 375/200 |
| 5,878,332 A | * | 3/1999 | Wang et al. ................. | 455/84 |
| 5,890,051 A | * | 3/1999 | Schlang et al. .............. | 455/76 |
| 5,950,119 A | * | 9/1999 | McGeehan et al. .......... | 455/302 |
| 5,960,364 A | * | 9/1999 | Dent ........................... | 455/552 |
| 6,006,105 A | * | 12/1999 | Rostoker et al. ............ | 455/552 |
| 6,029,052 A | * | 2/2000 | Isberg et al. ................ | 455/131 |
| 6,041,222 A | * | 3/2000 | Horton et al. ............... | 455/255 |
| 6,088,348 A | * | 7/2000 | Bell, III et al. .............. | 370/343 |
| 6,175,746 B1 | * | 1/2001 | Nakayama et al. .......... | 455/552 |
| 6,208,875 B1 | * | 3/2001 | Damgaard et al. .......... | 455/552 |

FOREIGN PATENT DOCUMENTS

| | | | | |
|---|---|---|---|---|
| EP | 0653851 | * | 11/1994 | ............ H04B/1/40 |
| WO | WO 97/30523 | * | 8/1997 | ............ H04B/1/40 |

* cited by examiner

*Primary Examiner*—Duc M. Nguyen
(74) *Attorney, Agent, or Firm*—Thomas, Kayden, Horstemeyer & Risley, L.L.P.

(57) ABSTRACT

A multi-band RF architecture including a GSM quadrature modulator for modulating an intermediate frequency (IF) wherein the frequency of the modulated IF signal is changed such that each of the GSM, DCS 1800, and PCS 1900 bands have a respective IF. An intermediate frequency (IF) filter with a pass band that covers the GSM IF, the DCS 1800 IF, and the PCS 1900 IF is connected to the output of the modulator and outputs to a transmit phase lock loop, which translates the IF signal from the IF filter to either a GSM band radio frequency signal, a DCS 1800 band radio frequency signal, or a PCS 1900 band radio frequency signal, depending on the frequency of a local oscillator (LO). The receiver employs a down converter which provides a down converted output signal selected by high side injection for the GSM band an by low side injection for the DCS 1800 and PCS 1900 bands. The down converter outputs to an intermediate frequency (IF) receiver filter centered at 400 MHz designed to pass either the down converted GSM signal, the down converted DCS signal, or the down converted PCS signal to demodulation circuitry. A single phase lock loop circuit is used to supply, on a single output, the LO signal for down converting either the GSM receive band, the DCS 1800 receive band, or the PCS 1900 receive band, as well as the LO for the transmit phase lock loop.

44 Claims, 4 Drawing Sheets

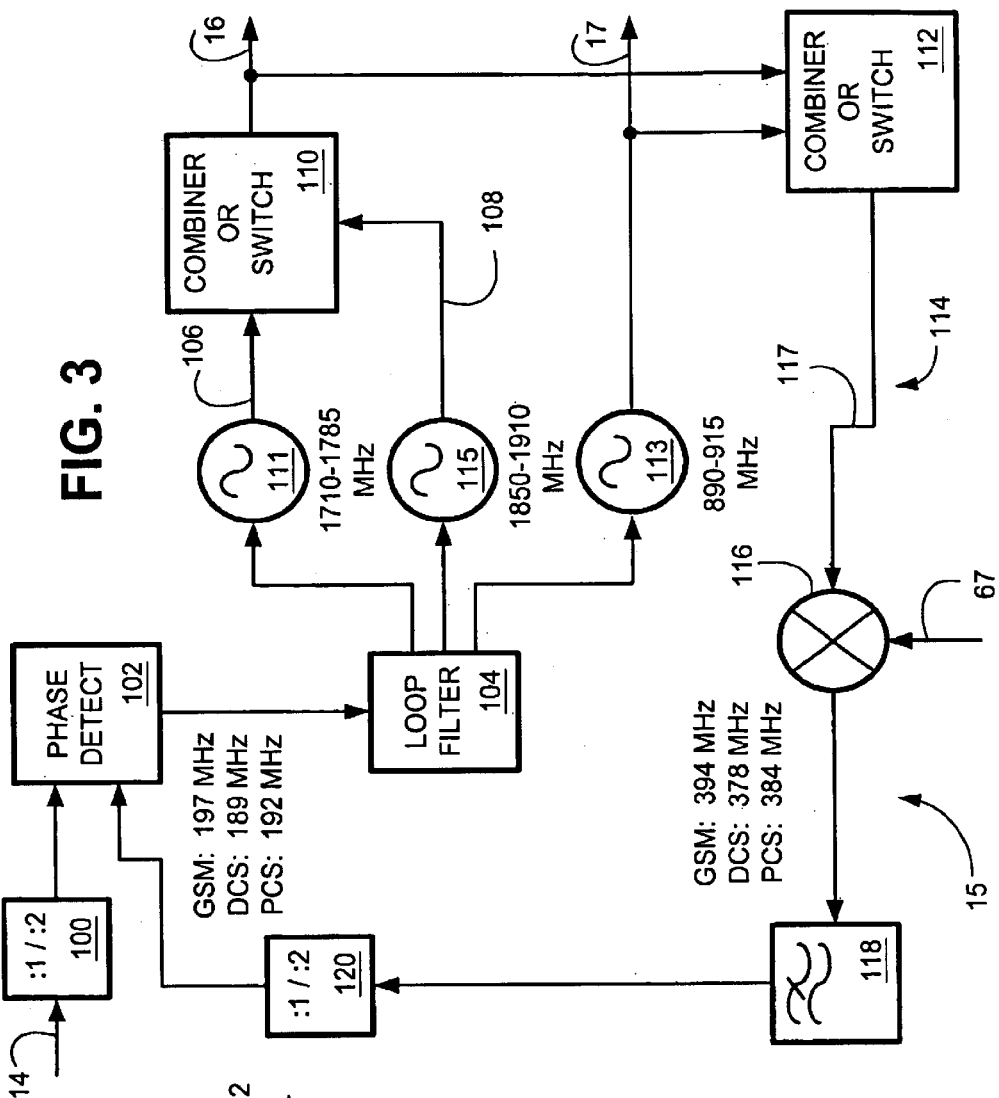

RF ARCHITECTURE FOR CELLULAR MULTI-BAND TELEPHONES

CROSS-REFERENCE TO RELATED APPLICATIONS

This application is a continuation-in-part (CIP) of U.S. patent application Ser. No. 09/057,124 filed on Apr. 8, 1998, now issued as U.S. Pat. No. 6,208,875, issue date of Mar. 27, 2001, for RF ARCHITECTURE FOR CELLULAR DUAL-BAND TELEPHONES. The disclosure of this application is hereby incorporated by reference herein.

BACKGROUND OF THE INVENTION

1. Field of the Invention

The subject invention relates to RF (radio frequency) systems and more particularly to an RF architecture for a multi-band cellular telephone.

2. Description of Related Art

Mobile phones have recently gained widespread use throughout the world. Mobile phones communicate with a base station serving a predetermined area or cell of a cellular network system, such as GSM. Each base station has a limited bandwidth within which to operate, depending upon the particular transmission technique utilized by the base station. This limited bandwidth is separated into a plurality of channels, which are frequency-spaced evenly from one another, and these plurality of channels are used by the mobile phones within that base station's transmission area. As a result, each base station can only handle a limited number of phones. The number of possible phones is equal to the number of channels and time-slots on those channels available at the base station. Therefore, the frequency spacing between channels is minimized in order to maximize the number of channels supported by the operating bandwidth of the base stations.

The capacity of base stations in highly populated areas can become saturated during time periods of high use. Mobile phones currently operate as single band phones, where the transmitted signal frequency is within the bandwidth of a base station operating on the same transmission method as the mobile phone. Thus, there is a need for mobile phones to operate with multiple band transmissions to increase system capacity, so that the system could select between multiple transmission frequency bands depending upon which bandwidth is less saturated and could provide a better signal quality.

Typically, in a conventional single band cellular phone, data to be transmitted by the telephone handset is fed to a transmitter including a differential encoder, where an in-phase component (I) and a quadrature component (Q) of the signal to be transmitted are created. The I and Q components are then passed through digital filters which give the modulation a particular shape. The resultant I and Q filtered signals are then modulated at a radio frequency for transmission and combined as a phase modulated signal. The phase modulated signal is then amplified to bring the signal to a desired power level for transmission. Digital modulators, such as a Gaussian minimum shift keying (GMSK) modulator, are typically used in digital wireless phones.

Most mobile phones are designed to be lightweight and portable, so that they may be easily carried on the person using the mobile phone, such as in their pocket or purse. It is therefore critical to design a mobile phone to be as small as possible, thus requiring the number of components to be minimized. With respect to design of a multi-band mobile phone, these considerations present serious design problems, for example, because the use of entirely separate transmitter and receiver circuits for the respective bands would result in a prohibitively large and complex phone. Additional problems confront implementation of a multi-band phone arising from the potential for generation of unwanted frequency components.

OBJECTS AND SUMMARY OF THE INVENTION

It is therefore an object of the present invention to improve mobile phone systems;

It is another object of the invention to provide a multi-band RF transmitter/receiver architecture;

It is a further object to improve RF architecture of mobile phone systems;

It is another object of the invention to provide a multi-band RF cellular phone architecture;

It is another object of the invention to provide such an RF multi-band architecture employing the DCS 1800, GSM, and PCS 1900 frequency bands;

It is another object of the invention to provide a multi-band RF cellular phone architecture which adds as little circuit complexity as possible as compared to a single band design;

It is another object of the invention to provide a multi-band RF cellular phone architecture which minimizes spurious (unwanted) frequency problems.

According to a first aspect of the invention, a multi-band RF architecture is provided including a modulator device for modulating an intermediate frequency (IF). The frequency of the modulated IF signal is changed such that a respective IF is used for each of the GSM, DCS 1800, and PCS 1900 bands. An intermediate frequency (IF) filter with a pass band that covers the GSM IF, the DCS 1800 IF, and the PCS 1900 IF is connected to the output of the modulator device and outputs to a transmit phase lock loop. The transmit phase lock loop translates the IF signal from the IF filter to either a DCS 1800 band radio frequency signal, a GSM band radio frequency signal, or a PCS 1900 band radio frequency signal, depending on the frequency of a local oscillator (LO) and whether the GSM transmit VCO, the DSC transmit VCO, or the PCS transmit VCO is active.

According to a second aspect of the invention, the RF architecture employs a down converter for receiving a GSM band signal, a DCS 1800 band signal, or a PCS 1900 band signal, and for supplying a down converted output signal at an output thereof, the down converted output signal being selected by high side injection for the GSM band and by low side injection for the DCS 1800 and PCS 1900 bands.

According to yet another feature of the invention, the down converter outputs to an intermediate frequency (IF) receiver filter designed to pass either the down converted GSM signal, the down converted DCS signal, or the down converted PCS signal. A particularly important inventive aspect of the design is that the receiver IF filter is centered at 400 Megahertz (MHz), which contributes to numerous advantages and simplification in the circuitry.

According to yet another aspect of the invention, a single phase lock loop circuit is used to supply, on a single output, the LO signal for down converting either the GSM receive band, the DCS 1800 receive band, or the PCS 1900 receive band, as well as to the transmit phase lock loop. In this manner, a common phase lock loop is used for down conversion in both the transmit and receive paths of the circuitry.

Those skilled in the art will appreciate the considerable number of advantages arising from the architecture of the preferred embodiment. It employs a common IF (Intermediate Frequency) filter for all RX bands, and a single transmit PLL (Phase Locked Loop) for up-converting the phase-modulated IF for all TX bands. The architecture further employs a common IF VCO for both the receive and transmit path. Finally, a common PLL is used for generating the LO (Local Oscillator) signal for the first down-conversion in the receive path and the down-conversion in the PLL of the transmit path. Thus, the frequency plan and other aspects of the RF architecture permits the same IF filters, mixers, VCOs and PLLS to be used regardless of the active band.

The disclosed architecture achieves the goal of adding as little circuitry as possible as compared to a single band design while minimizing effects of unwanted (spurious) frequency components. Thus, the preferred embodiment exhibits superior operational capabilities combined with greatly reduced circuit complexity.

BRIEF DESCRIPTION OF THE DRAWINGS

The exact nature of this invention, as well as its objects and advantages, will become readily apparent upon reference to the following detailed description when considered in conjunction with the accompanying drawings, in which like reference numerals designate like parts throughout the figures thereof, and wherein:

FIG. 2 is a circuit block diagram of a modulator employable in the architecture of FIG. 1;

FIG. 3 is a circuit block diagram illustrating a transmit phase lock loop circuit employable in the architecture of FIG. 1;

DESCRIPTION OF THE PREFERRED EMBODIMENTS

The following description is provided to enable any person skilled in the art to make and use the invention and sets forth the best modes contemplated by the inventors of carrying out their invention. Various modifications, however, will remain readily apparent to those skilled in the art, since the general principles of the present invention have been defined herein specifically to provide optimal operation and minimal circuit complexity.

Figure 1:
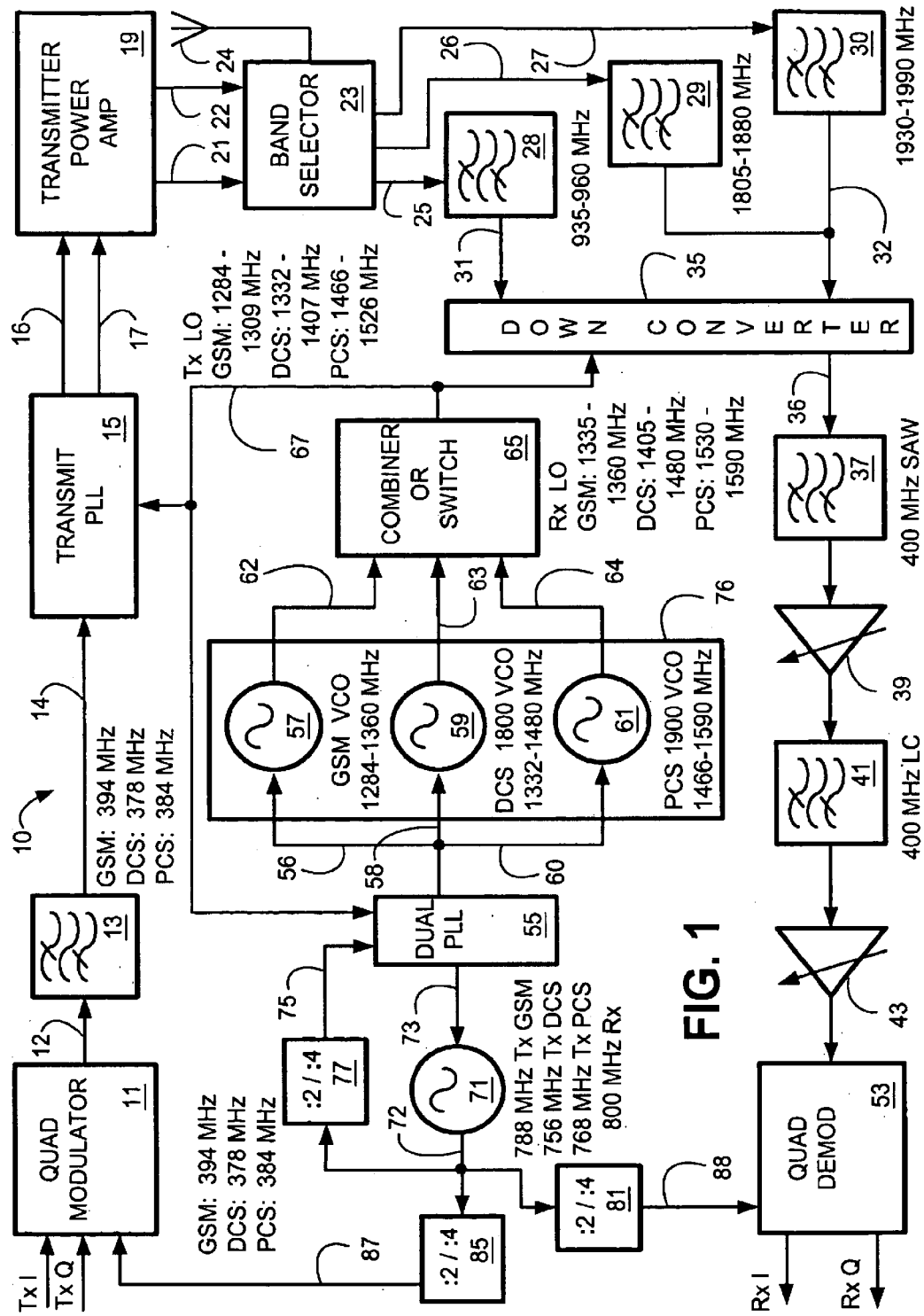
FIG. 1 is a circuit block diagram illustrating the RF multi-band phone architecture of the preferred embodiment.

The preferred embodiment of the multi-band cellular telephone architecture 10 is illustrated in FIG. 1. The particular embodiment of FIG. 1 is for a GSM/DCS/PCS multi-band cellular telephone having transmit frequency bands of 890 to 915 MHz for the GSM band, 1710–1785 MHz for the DCS 1800 band, and 1850–1910 MHz for the PCS 1900 band. The present invention will be specifically described with respect to these three frequency bands. However, it is understood that the teachings of the present invention can be extended to other frequency bands or additional frequency bands as well.

In FIG. 1, a quadrature modulator 11 generates a transmit IF frequency signal from the transmit quadrature base band inputs TxI and TxQ. The modulated output signal on line 12 is at a carrier frequency of 394 MHz for the GSM band, 378 MHz for the DCS band, and 384 MHz for the PCS band. The output on line 12 is supplied to a transmit IF filter 13 centered at 400 MHz. The transmit IF filter 13 in turn outputs a filtered intermediate frequency signal to a transmit phase lock loop (PLL) 15.

The main purpose of the Tx IF filter 13 is to reject harmonics of the IF signal. The filter 13 is a band-pass filter with a pass-band wide enough to pass both the 394 MHz GSM Tx IF signal, the 378 MHz DCS 1800 Tx IF signal, and the 384 MHz PCS 1900 Tx IF signal with little attenuation. A secondary function of the Tx IF filter is to limit the wide-band noise to the input of the transmit PLL.

In the DCS and PCS modes, the transmit PLL 15 produces an output signal on line 16 in the respective frequency band, while in the GSM mode, the transmit PLL 15 produces an output signal on line 17 in the GSM frequency band. The signal lines 16 and 17 are supplied to a power amplifier circuit 19, which in turn provides respective DCS, PCS, and GSM output signals over signal lines 21, 22 to a band selector 23. The band selector 23 determines which frequency band is output to the antenna 24. The band selector 23 includes a band diplex filter, such as Murata Part No. FKN0106A.

The function of the diplex filter in the band selector 23 is to combine the GSM band with either the DCS 1800 band or the PCS 1900 band at the output of the filter. The diplex filter is in principle a low-pass filter (for the GSM band) and a high-pass filter (for the DCS 1800 and PCS 1900 bands) with the outputs combined into a single output. In addition to combining the bands, the diplex filter also provides isolation from the DCS 1800/PCS 1900 power amplifier output to the GSM power amplifier output and vice versa. Also, since a low-pass filter constitutes the GSM path of the diplex filter, harmonic attenuation of the GSM transmitter is provided. There need not be a diplex filter in the band selector 23. The same function can be achieved by a combination of switches and filters.

On the receive side, the band selector 23 outputs either a received GSM signal, a received DCS signal, or a received PCS signal on respective signal lines 25, 26, 27 to respective filters 28, 29, 30. The front end filters 28, 29, 30 have respective pass bands of 935 to 960 MHz, 1805 to 1880 MHz and 1930 to 1990 MHz. The front end filter 28 outputs over signal line 31 to down converter 35, while front end filters 29 and 30 output over signal line 32 to the down converter 35. The down converter 35 down converts the received RF frequency signal to an intermediate (IF) frequency signal which is supplied on signal line 36 to an IF filter 37.

The IF filter 37 is a SAW band pass filter centered at 400 MHz. The Rx IF filter 37 has a 3 dB bandwidth of about 200 kHz (the channel bandwidth in the GSM system) and a center frequency of 400 MHz. This filter 37 provides the selectivity of the receiver, and attenuates neighboring channels and other unwanted signals.

The output of the IF filter 37 is supplied to a first IF programmable gain amplifier 39, which outputs to a filter 41 which in turn outputs to a second IF programmable gain amplifier 43. The filter 41 limits the bandwidth of the amplifier chain 39, 43 to avoid oscillation caused by unwanted feedback and may comprise a simple LC tank. The output of the second amplifier 43 is supplied to a quadrature demodulator circuit 53 which down converts the received IF signal to a complex base band output signal Rx I, Rx Q.

Various functional units of the circuit of FIG. 1 are supplied with required operating frequencies by frequency generating circuitry including a dual phase lock loop 55. The phase lock loop 55 outputs over a signal line 56 to a first VCO 57, over a signal line 58 to a second VCO 59, and over a third signal line 60 to a third VCO 61. The first VCO 57 operates in the GSM mode and its range is 1284 to 1350 MHz. The second VCO 59 operates in the DCS mode and its range is 1332 to 1480 MHz. The third VCO 61 operates in PCS mode and its range is 1466 to 1590 MHz. The VCO's 57, 59, 61 output over respective signal lines 62, 63, 64 to a combiner or switch 65. The switch 65 selects the appropriate output 62,63, or 64 and causes it to appear on signal line 67 as a local oscillator (LO) frequency. This LO frequency on line 67 is supplied to the down converter 35, the transmit PLL 15, and the dual PLL 55. The three VCO's 57, 59, and 61 can be replaced by a single VCO covering the total range 1284 MHz to 1590 MHz, or a switch VCO with a control input determining whether the output covers the GSM range, the DCS 1800 range, or the PCS 1900 range.

The dual PLL 55 further provides a signal output on line 73 to an IF VCO 71, which comprises a common IF VCO for both the transmit and receive paths. The dual PLL 55 comprises two conventional PLLs locked to the same reference (not shown). The output signal of the IF VCO 71 on signal line 72 is supplied to a PLL feedback path divider 77, a receive path divider 81, and a transmit path divider 85. The output of the PLL feedback path divider 77 is supplied over signal line 75 to the dual PLL 55. The output of the transmit path divider 85 is supplied over a signal line 87 to the quadrature modulator 11, and the output of the receive path divider 81 is supplied over signal line 88 to the quadrature demodulator 53. The IF VCO 71 operates at double the LO frequency and provides output signals on line 72 at 783 MHz for the transmit GSM, 756 MHz for the transmit DCS, 768 MHz for the transmit PCS, and 800 MHz for the demodulator 53.

The IF VCO 71 is tunable to cover the range 756 MHz to 800 MHz. Because the GSM system is a TDMA (time division multiple access) system, the phone is not receiving and transmitting at the same time and there is time between the receive and transmit burst to lock the IF VCO 71 to the desired frequency (by means of the PLL).

FIG. 2 illustrates the quadrature modulator 11 in more detail. The modulator 11 preferably employs Gaussian minimum shift-keying (GMSK) and includes a 90 degree phase shift circuit 89, and first and second modulators or mixers 91, 93. In GSM mode, a 394 MHz IF LO signal is input to the phase shifter 89. In PCS mode, a 384 MHz IF LO signal is input to the phase shifter 89, while in DCS mode, a 378 MHz IF LO signal is input to the phase shifter 89. One of the multipliers 91, 93 is supplied with a zero degree phase shifted IF LO signal, and the second of the multipliers 91, 93 is supplied with an IF LO signal shifted in phase by 90 degrees. The outputs 92, 94 of the modulators 92, 94 are combined by a combiner 95 and appear on output line 12 to the transmit PLL 15.

A suitable transmit circuit 15 employing first, second, and third VCO's is shown in FIG. 3. The circuit of FIG. 3 provides the DCS band transmit frequency at the output of the VCO 111, the GSM band transmit frequency at the output of the VCO 113, and the PCS band transmit frequency at the output of VCO 115. Alternatively, the transmit PLL 15 may be constructed to employ a single VCO to supply the DCS, GSM, and PCS band transmit frequencies as taught in the copending application by the inventors hereof entitled Modulation Technique For Multi-band Applications, filed Mar. 19, 1998, U.S. Ser. No. 09/044,281, now issued as U.S. Pat. No. 6,005,443, issue date of Dec. 21, 1999, incorporated by reference herein.

In the circuit of FIG. 3, a phase modulated intermediate input frequency (OF) on line 14 is input to a first divider 100 of the PLL circuit 15. The output of the divider 100 is then input into a phase detector 102. The phase detector 102 outputs a voltage that is proportional to a phase difference between its two input frequencies. This phase detector output voltage is then input into a loop filter 104. The loop filter 104 smoothes the phase detector output voltage and determines the loop performance based upon selected loop filter values. When the phone is in transmit mode, only one of the three transmit VCO's 111, 113, 115 is active. Thus, the output of the loop filter 108 adjusts the active transmit VCO's 111, 113, or 115 and determines its output frequency. The VCO's 111 and 115 output over respective signal lines 106, 108 to a combiner or switch 110. The switch 110 selects the appropriate output 106 or 108 and outputs to line 16 and to a combiner or switch 112. The VCO 113 outputs to line 17 and switch 12.

The feedback loop 114 of the PLL 15 contains a mixer 116 which mixes a local oscillator signal $RF_{LO}$ on line 67 with the $RF_{OUT}$ signal on signal line 117. The output of the mixer 116 is input into a bandpass (BP) filter 118. The output of the mixer 116 may be referred to as the "feedback frequency." The selected outputs of the mixer 116 are either $RF_{OUT}$-$RF_{LO}$ or $RF_{LO}$-$RF_{OUT}$ (assuming frequency down-conversion). The bandpass filter 118 removes any unwanted mixing products produced by the mixer 116 and determines which frequency is fed-back through the divider 120.

The PLL circuit 15 operates to translate (i.e., move) the frequency of the input IF frequency on signal line 14 to the VCO frequency with the same phase. Thus, by adjusting the value of the $RF_{LO}$ frequency 67, a desired output frequency $RF_{OUT}$ is produced for a given intermediate frequency (IF) on line 14. As will be appreciated, the first PLL VCO 111 outputs a signal having a frequency in the DCS transmit band (1710–1785 MHz), the second PLL VCO 113 outputs a signal of frequency in the GSM transmit band (890–915 MHz), and the third PLL VCO 115 outputs a signal of frequency in the PCS transmit band (1850–1910 MHz). In transmit mode, the $RF_{OUT}$ frequency of the active transmit VCO 111, 113, or 115 is fed back via the switch 110, feedback loop 114 and the combiner or switch 112. Frequencies in MHz for the transmit mode at various points in the circuit of FIG. 3 are:

|  | DCS | GSM | PCS |
|---|---|---|---|
| LO (line 67): | 1332–1407 | 1284–1309 | 1466–1526 |
| signal line 103 | 378 | 394 | 384 |
| signal line 105 | 189 | 197 | 192 |

Figure 4:
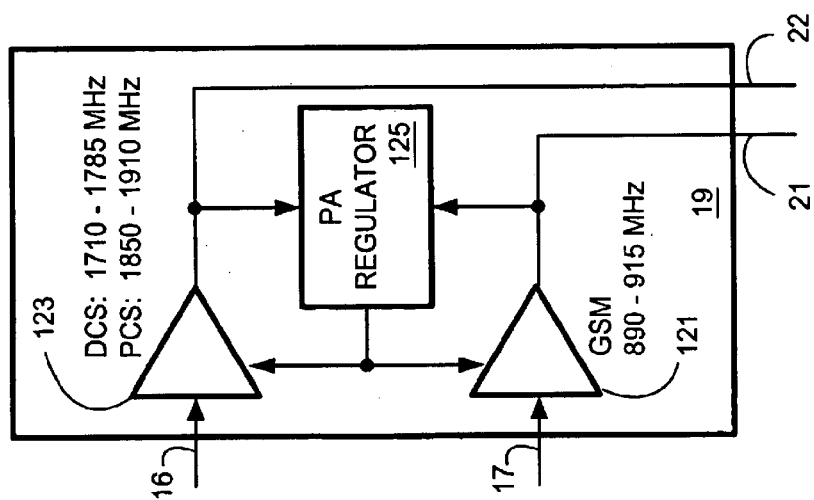
FIG. 4 is a circuit diagram of a power amplifier circuit employable in the architecture of FIG. 1.

As shown in FIG. 4, the transmit output RF signals on respective signal lines 16, 17 from the transmit PLL 15 are supplied to respective RF power amplifiers 121, 123 of the transmit power amplifier circuit 19. The outputs of RF amplifiers 121, 123 are regulated by a power amplifier regulator 125 and their respective regulated outputs appear on the signal lines 21, 22 provided to the band selector 23. In alternate embodiments, a single power amplifier could be employed with a band selector switch on its input. Various other known arrangements of power amplifier circuitry may also be employed.

Figure 5:
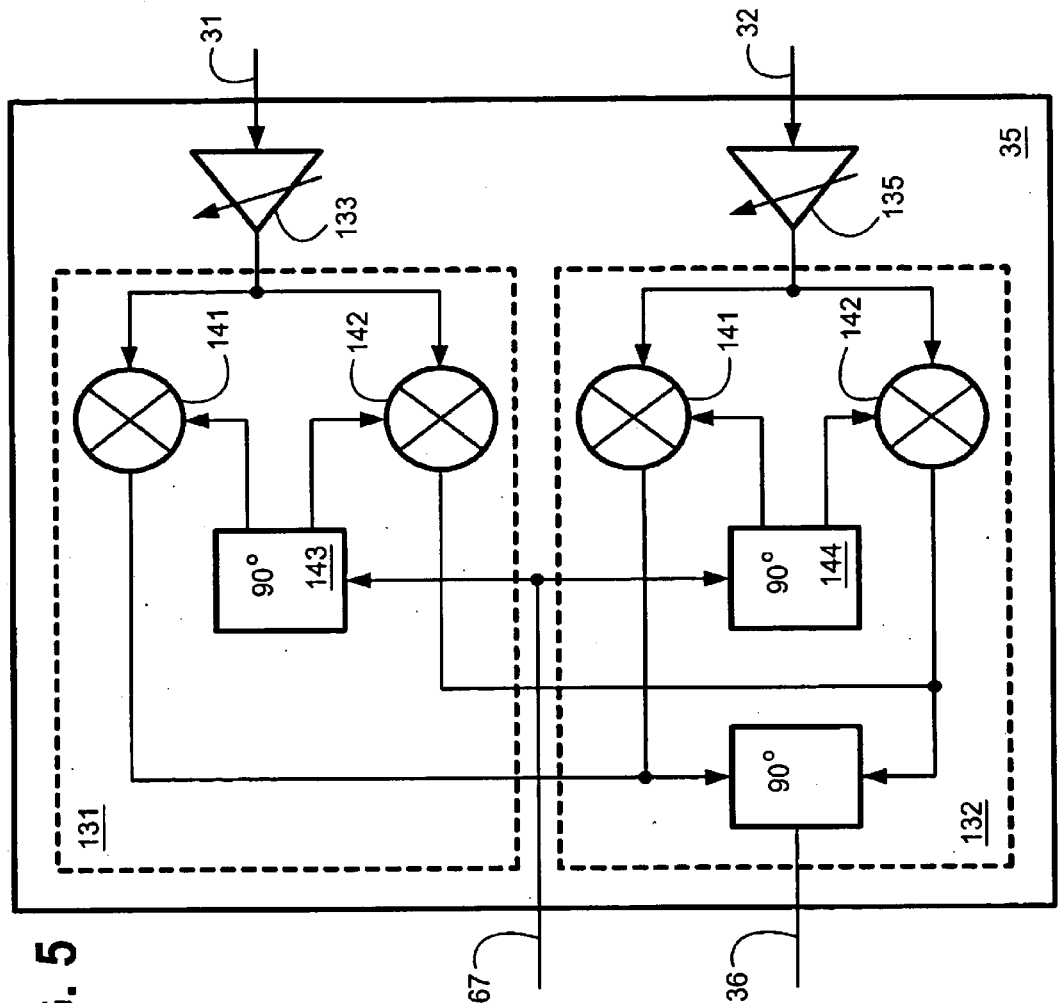
FIG. 5 is a circuit diagram of down-converter circuitry employable in the architecture of FIG. 1.
Figure 6:
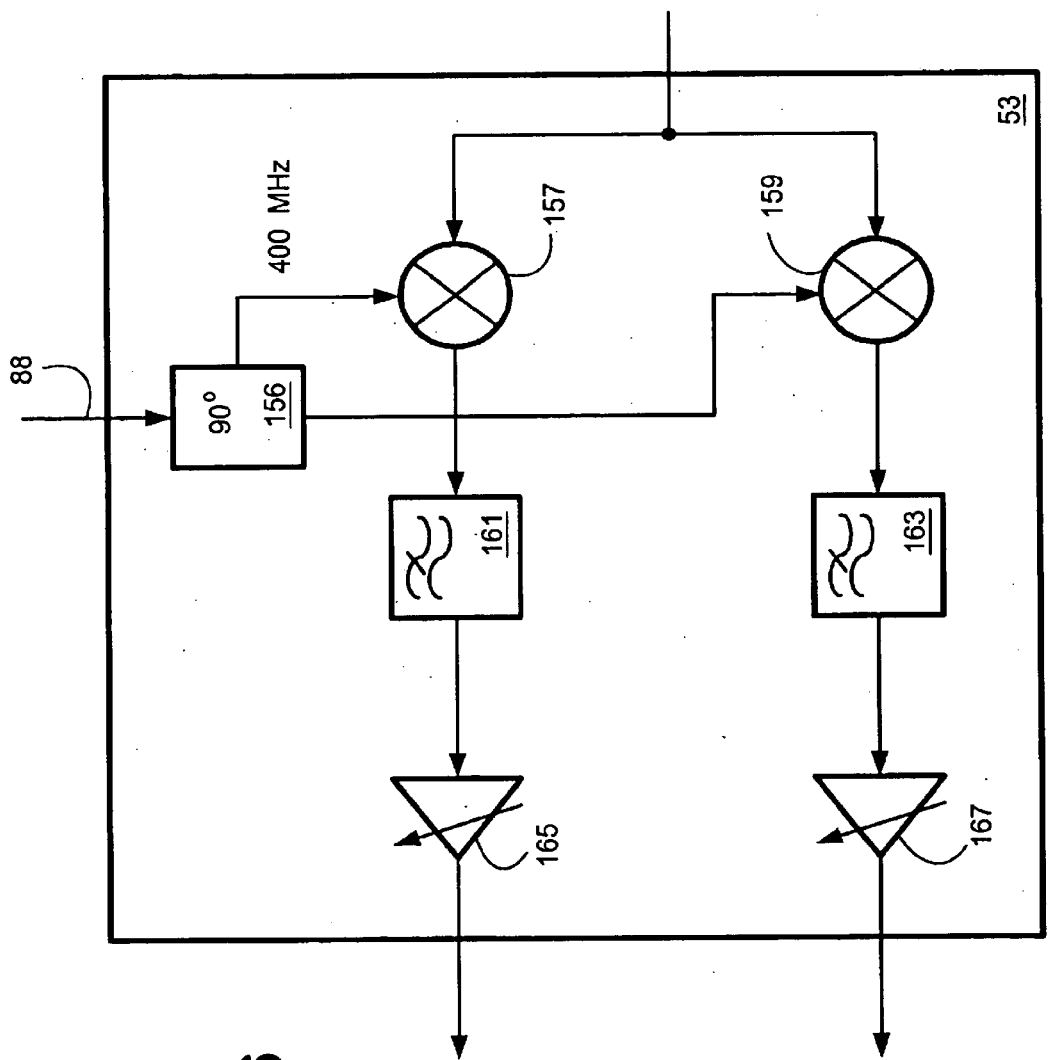
FIG. 6 is a circuit diagram of a demodulator employable in the architecture of FIG. 1.

The down converter 35 is illustrated in more detail in FIG. 5. The particular circuit shown contains a respective single side band (SSB) image reject mixer circuit 131, 132 and a respective low noise amplifier (LNA) 133, 135 for each band with input from the respective signal lines 31, 32. Each image reject mixer 131, 132 is illustrated as containing first and second mixers 141, 142 with appropriate local oscillator (LO) signals being supplied as second inputs after appropriate phase shifts by phase shift blocks 143, 144. The Rx LO frequencies are in the range of 1335 to 1360 MHz for the GSM mode, 1405 to 1480 MHz for the DCS mode, and 1530 to 1590 MHz for the PCS mode. Various other arrangements of mixers and LNA's may be used to achieve the same results, as those skilled in the art aided by this disclosure will appreciate. The down converter 35 outputs to a conventional quadrature demodulator 53 which, as shown in FIG. 6, may include a 90° phase shift circuit 156, first and second mixers 157, 159, first and second filters 161, 163 and first and second amplifiers 165, 167.

A general problem with heterodyne receivers (i.e., receivers that use down conversion) is the suppression of the so-called image frequency. In such receivers, the IF frequency signal is generated by mixing the received RF (Radio Frequency) signal with a LO signal, with frequency $f_{LO}$ given by:

| | $f_{LO} = f_{RF} + f_{IF}$ | (for high side injection) |
|---|---|---|
| and | $f_{LO} = f_{RF} - f_{IF}$ | (for low side injection) |
| where | $f_{RF}$ is the frequency of the wanted RF signal | |
| and | $f_{IF}$ is the frequency of the IF signal | |

In the case of, for example, high side injection, the frequency of the wanted RF signal is:

$f_{RF} = f_{LO} - f_{IF}$ (for high side injection)

but an unwanted signal at frequency $f_{LO} + f_{IF}$ will be down converted to the IF as well (by low side injection). This unwanted signal is called the image frequency. Thus, signals at the image frequency must be attenuated before reaching the IF stage of the receiver.

One important characteristic of the preferred architecture is that the LO used for RX down conversion and the down conversion in the transmit PLL is "high side injection" for the GSM band and "low side injection" for the DCS 1800 and PCS 1900 bands. The image frequency in the preferred embodiment thus lies in the range 1005 to 1080 MHz for the DCS mode, within the range 1735 to 1760 MHz for the GSM mode (1725–1760 MHz for EGSM), and within the range 1130 to 1190 for the PCS mode. With a 400 MHz IF filter, the image filtering needed can be easily obtained. As noted above, the band-selector 23 contains a band diplex filter. This filter can have 20 dB or more attenuation of each of the GSM, DCS 1800, and PCS 1900 image frequencies with a 400 MHz IF. The RX IF could range from 378 to 410 MHz, keeping in mind that as the RX IF gets lower, the LO range gets wider.

Alternately, the front end circuitry of the receiver may be constructed in accordance with the disclosure of copending U.S. patent application Ser. No. 09/036,258 by John B. Rowland, Jr., filed Mar. 6, 1998, and assigned to the assignee hereof. According to such disclosure, a high pass elliptical filter and SAW filter (29) are used for image rejection on the DCS channel 26 and a single SAW filter (28) is used for image rejection on the GSM channel 25. In a similar manner, a single SAW filter 30 is used for image rejection on the PCS channel 27.

Another important characteristic of the preferred architecture is that the frequency tuning range of the main LO 76 is chosen so that one oscillator with a switching tank circuit can cover its function (shown as three individual VCO's 57, 59, 61 on FIG. 1) to save space and cost. The LO 76 could also be a non-switching type. The total frequency range of the preferred LO 76 is 1284 to 1590 MHz (306 MHz).

Furthermore, as noted above, the IF VCO 71 is set to run at the double LO frequency and then is divided by the internal dividers 85, 81, 77 for both the TX path 87, the RX path 88 and the PLL feedback path 75. This arrangement reduces unwanted feedback to the IF VCO 71. The unwanted feedback in the case of no dividers would be:

1) from the modulated IF 12, 14 to the IF VCO 71, which would then be running at the same frequency, but not modulated; and
2) from the IF VCO 71 to the Rx IF 36, which also would be at the same frequency.

In the preferred embodiment, the output signal frequencies on the respective paths 87, 88, 75 are as follows (in MHz):

| | GSM Rx | GSM Tx | PCS Rx | PCS Tx | DCS 1800 Rx | DCS 1800 Tx |
|---|---|---|---|---|---|---|
| 87 | (not active) | 394 MHz | (not active) | 384 MHz | (not active) | 378 MHz |
| 88 | 400 MHz | (not active) | 400 MHz | (not active) | 400 MHz | (not active) |
| 75 | 400 MHz | 394 MHz | 400 MHz | 384 MHz | 400 MHz | 378 MHz |

It will be appreciated that the phone has seven active modes: GSM Tx, GSM Rx, DCS 1800 Tx, DCS 1800 Rx, PCS 1900 Tx, PCS 1900 Rx, and transition mode (transition mode being when the phone is changing between the six other active modes). In addition to the active modes, the phone can be in idle mode of power down. A system microcontroller preferably controls and sequences switching functions necessary to transition from one mode to another.

It will be observed that the frequencies employed in the preferred embodiment minimize spurious problems:

The 400 MHz Rx IF avoids low order Rx spurs (lowest orders is 3-by-4 for DCS 1800, 3-by-6 for GSM, and 5-by-6 for PCS).

Harmonics of the 400 MHz Rx LO falls outside the RX bands.

No harmonics of the 13 MHz GSM system clock is within a channel-BW distance from the Rx IF.

The high RX IF of 400 MHz makes image-filtering in the front-end relatively easy.

The Tx IF's have no harmonics in the active Tx or Rx band:

| GSM (Tx IF = 197 MHz): | 4th: | 788 MHz |
| --- | --- | --- |
|  | 5th: | 985 MHz |
| DCS 1800 (Tx IF = 189 MHz): | 9th: | 1701 MHz |
|  | 10th: | 1890 MHz |
| PCS 1900 (Tx IF = 192 MHz): | 9th: | 1728 MHz |
|  | 10th: | 1890 MHz |
|  | 11th: | 2112 MHz |

The zero-crossing spurs in the active Tx band are of high order. The lowest order zero crossing spur for GSM is 5-by-33. For DCS 1800, it is 3-by-22. For PCS, it is 3-by-23.

Those skilled in the art will appreciate the considerable number of advantages arising from the architecture of the preferred embodiment. It employs a common IF (Intermediate Frequency) filter for all three RX bands, and a single transmit PLL (Phase Locked Loop) for up-converting the phase-modulated IF for all three TX bands. The architecture further employs a common IF VCO for both the receive and transmit path. Finally, a common PLL is used for generating the LO (Local Oscillator) signal 67 for the first down-conversion in the receive path and the down-conversion in the PLL 15 of the transmit path. Thus, the preferred embodiment exhibits superior operational capabilities combined with greatly reduced circuit complexity.

Those skilled in the art will additionally appreciate that various—adaptations and modifications of the just-described preferred embodiment can be configured without departing from the scope and spirit of the invention. For instance, the triple band GSM/DCS 1800/PCS 1900 architecture described in the preferred embodiment could be easily modified to support additional bands by incorporating additional VCO's, filters, and other components for the additional bands. Therefore, it is to be understood that, within the scope of the appended claims, the invention may be practiced other than as specifically described herein.

What is claimed is:

1. An RF multi-band phone circuit for operating in the DCS 1800, GSM, and PCS 1900 frequency bands, comprising:
   a modulator device for producing an output comprising a pair of baseband signals (I and Q) modulating a first continuous wave (CW) intermediate frequency (IF) for the GSM band, a second continuous wave (CW) intermediate frequency (IF) for the DCS 1800, or a third continuous wave (CW) intermediate frequency (IF) for the PCS 1900 band;
   a single IF VCO;
   a divider connected to the output of said IF VCO for generating an IF frequency signal for said modulator device, an IF frequency signal for a demodulator device and a phase lock loop feedback signal;
   an intermediate frequency filter having an input and an output, the input of said filter being connected to the output of said modulator device;
   a transmit phase lock loop device having an input connected to the output of said filter for translating an IF frequency signal at its input to either a DCS 1800 band radio frequency signal, a GSM band radio frequency signal, or a PCS 1900 band radio frequency signal, depending on the frequency of a local oscillator signal supplied thereto; and
   an amplifier device for amplifying the output of said transmit phase lock loop device and for supplying the amplified signal to an antenna for transmission.

2. The circuitry of claim 1 wherein said transmit phase lock loop device employs a single phase detector.

3. The circuitry of claim 1 further including:
   a down converter device for receiving a GSM band signal, a DCS 1800 band signal, or a PCS 1900 band signal and for supplying a down converted output signal at an output thereof, said output signal being selected by high side injection for the GSM band and low side injection for the DCS 1800 and PCS 1900 bands.

4. The circuitry of claim 3 further including:
   an intermediate frequency (IF) receiver filter having an input connected to the output of said down converter device, said IF filter being centered at 400 Megahertz (MHz).

5. The circuitry of claim 4 wherein said IF receiver filter has a 3 db bandwidth of 200 KHz.

6. The circuitry of claim 4 further including a filter means for providing at least 20 db attenuation of the GSM, DCS 1800, and PCS 1900 image frequencies.

7. The circuitry of claim 3 wherein said down converter device employs a first local oscillator (LO) frequency for down converting said GSM band signal, a second LO frequency for down converting said DCS 1800 signal, and a third LO frequency for down converting said PCS 1900 signal.

8. The circuitry of claim 7 further including a single phase lock loop circuit for supplying on a single output either said first LO frequency signal, said second LO frequency signal, or said third LO frequency signal to said down converter device and to said transmit phase lock loop device for effecting a down conversion in said phase lock loop circuit, whereby a common phase lock loop circuit is used for down conversion in both the transmit and receive paths of said circuitry.

9. The circuitry of claim 3 further including an intermediate frequency receiver filter having a center frequency lying in the range of 378 MHz to 410 MHz.

10. The circuitry of claim 1 further including:
    an intermediate frequency (IF) filter having an input connected to the output of said down converter device, said IF filter being centered at 400 Megahertz (MHz).

11. The circuitry of claim 1 wherein said first continuous wave IF frequency is 394 MHz, said second continuous wave IF frequency is 378 MHz, and said third continuous wave IF frequency is 384 MHz.

12. The circuitry of claim 1 wherein said intermediate frequency filter is a bandpass filter with a passband wide enough to pass said first, second, and third continuous wave IF frequencies.

13. The circuitry of claim 1 wherein said single IF VCO is tunable to cover a range of 756 MHz to 800 MHz.

14. The circuitry of claim 13 further including a main local oscillator having a range of from 1284 MHz to 1590 MHz.

15. A radio frequency (RF) receiver device comprising:
    a down converter device for receiving a plurality of RF signals comprising a GSM band signal, a DCS band signal, or a PCS band signal and for supplying a down converted output signal at an output thereof, said output signal being selected by high side injection for the GSM band and low side injection for the DCS and PCS bands;
    a first image reject mixer, residing in said down converter device, configured to receive at least one of said plurality of RF signals in a GSM mode;
    a second image reject mixer, residing in said down converter device, configured to receive at least another one of said plurality of RF signals in a DCS mode and in a PCS mode; and an intermediate frequency (IF) filter having an input connected to the output of said down converter device, said IF filter being centered at 400 Megahertz (MHz).

16. The receiver device of claim 15 wherein said down converter device employs a first local oscillator (LO) frequency for down converting said GSM band signal, a second LO frequency for down converting said DCS band signal, and a third LO frequency for down converting said PCS band signal.

17. The receiver device of claim 16 further including a single phase lock loop circuit for supplying either said first LO frequency signal, said second LO frequency signal, or said third LO frequency signal on a single output to said down converter device.

18. The receiver device of claim 15 further comprising:

a single IF VCO configured to provide signals corresponding to a plurality of three or more frequency bands; and a divider device connected to the output of said IF VCO for generating from said signals an IF frequency signal for a modulator, an IF frequency signal for a demodulator, and a phase lock loop feedback signal.

19. The circuitry of claim 18 wherein said single IF VCO is tunable to cover a range of 756 MHz to 800 MHz.

20. A method of processing a received GSM/DCS 1800/PCS 1900 band signal comprising the steps of:

receiving a signal communicated in at least one of a GSM band, a DCS 1800 band and a PCS 1900 band;

filtering said signal using a plurality of filters, each of said filters being tuned to only one of said GSM band, said DCS 1800 band and said PCS 1900 band;

processing said GSM band with a first image reject mixer to generate a downconverted signal corresponding to said GSM band;

processing said DCS 1800 band with a second image reject mixer to generate said downconverted signal corresponding to said DCS 1800 band;

processing said PCS 1900 band with said second image reject mixer to generate said downconverted signal corresponding to said PCS 1900 band;

selecting said downconverted signal by high side injection for the GSM band and lowside injection for the DCS 1800 and PCS 1900 bands; and filtering said downconverted signal utilizing an intermediate frequency filter having a center frequency lying in the range of 378 MHz to 410 MHz.

21. The method of claim 20 wherein said center frequency is selected to be 400 MHz.

22. The method of claim 21 wherein said filter is selected to have a 3 db bandwidth of 200 KHz.

23. A method of generating a multi-band RF output for an RF multi-band phone operating in DCS 1800, GSM, and PCS 1900 frequency bands, comprising the steps of:

receiving a portion of an intermediate frequency (IF) local oscillator (LO) signal, the IF LO signal being divided and communicated to a modulator, demodulator and a dual phase lock loop (PLL);

producing an output from said received portion of the IF LO signal comprising a pair of baseband signals (I and Q) modulating a first continuous wave (CW) intermediate frequency (IF) for the GSM band, a second continuous wave (CW) intermediate frequency (IF) for the DCS 1800 band, or a third continuous wave (CW) intermediate frequency (IF) for the PCS 1900 band;

filtering said output with an intermediate frequency filter to produce a filtered output; and translating said filtered output IF frequency signal to either a DCS band radio frequency signal, a GSM band radio frequency signal, or a PCS band radio frequency signal, wherein said translating is performed by a transmit phase lock loop device employing a single phase detector.

24. An RF multi-band phone circuit for operating in one of a plurality of supported frequency bands, comprising:

a modulator device for producing an output comprising a pair of baseband signals (I and Q) modulating a continuous wave (CW) intermediate frequency (IF) for a respective one of the supported frequency bands, wherein said plurality of supported frequency bands comprises three or more frequency bands;

a single IF VCO;

a divider connected to the output of said IF VCO for generating an IF frequency signal for said modulator device, an IF frequency signal for a demodulator device and a phase lock loop feedback signal;

an intermediate frequency filter having an input and an output, the input of said filter being connected to the output of said modulator device;

a transmit phase lock loop device having an input connected to the output of said filter for translating an IF frequency at said respective one frequency band, depending on the frequency of a local oscillator signal supplied thereto; and an amplifier device for amplifying the output of said transmit phase lock loop device and for supplying the amplified signal to an antenna for transmission.

25. The circuitry of claim 24, wherein said transmit phase lock loop device employs a single phase detector.

26. The circuitry of claim 24 further including a down converter device for receiving one of the supported frequency bands and for supplying a down converted output signal at an output thereof.

27. The circuitry of claim 26 wherein said down converter device employs a respective local oscillator (LO) frequency for each of the supported frequency bands for down converting said down converted output signal.

28. The circuitry of claim 27 further including a single phase lock loop circuit for supplying on a single output said LO frequency signal to said down converter device and to said transmit phase lock loop device for effecting a down conversion in said phase lock loop circuit, whereby a common phase lock loop circuit is used for down conversion in both the transmit and receive paths of said circuitry.

29. The circuitry of claim 26, further comprising an intermediate frequency (IF) filter having an input connected to the output of said down converter device, said IF filter being centered at 400 Megahertz (MHz).

30. The circuitry of claim 24 wherein said intermediate frequency filter is a bandpass filter with a passband wide enough to pass said continuous wave IF frequencies for all of the supported frequency bands.

31. A multi-band cellular telephone transmit circuit, comprising:

a signal modulation device configured to output intermediate frequency signals corresponding to a plurality of three or more frequency bands in response to the input of base band signals;

a single IF VCO;

a divider connected to the output of said IF VCO for generating an IF frequency signal for said signal modulation device, an IF frequency signal for a demodulator device and a phase lock loop feedback signal;

a signal filtering device electrically connected to said signal modulation device and configured to output filtered intermediate frequency signals in response to the input of said intermediate frequency signals;

a phase lock loop device electrically connected to said signal filtering device and configured to output radio frequency signals corresponding to said plurality of three or more frequency bands in response to the input of said filtered intermediate frequency signals;

a signal amplifying device electrically connected to said phase lock loop device and configured to output amplified radio frequency signals in response to the input of said radio frequency signals;

a frequency band selector device electrically connected to said signal amplifying device and configured to selectively output said amplified radio frequency signals dependent on the frequency band of said amplified signals; and a frequency generating circuitry in electrical communications with said signal modulation device and said phase lock loop device, and configured to provide a plurality of three or more operating frequencies corresponding to said plurality of frequency bands.

32. The circuit of claim 31 wherein said plurality of frequency bands comprises the GSM frequency band, the DCS 1800 frequency band, and the PCS 1900 frequency band.

33. The circuit of claim 31 wherein said frequency generating circuitry comprises:

a plurality of three or more voltage controlled oscillators configured to generate oscillating signals at radio frequencies corresponding to one of said plurality of frequency bands; and an intermediate frequency voltage controlled oscillator electrically coupled to said plurality of voltage controlled oscillators and configured to generate oscillating signals at intermediate frequencies corresponding to each of said plurality of frequency bands.

34. The circuit of claim 31 wherein said frequency generating circuitry comprises:

a voltage controlled oscillator configured to generate oscillating signals at radio frequencies corresponding to each of said plurality of frequency bands; and an intermediate frequency voltage controlled oscillator electrically coupled to said voltage controlled oscillator and configured to generate oscillating signals at intermediate frequencies corresponding to each of said plurality of frequency bands.

35. A multi-band cellular telephone receive circuit, comprising:

a frequency band selector device configured to selectively output received radio frequency (RF) signals dependent on the frequency band of said received RF signals;

a plurality of three or more front end signal filtering devices electrically connected to said frequency band selector, each of said front end signal filtering devices being configured to transmit said received radio frequency signals corresponding to a different one of a plurality of three or more frequency bands;

a signal down conversion device electrically connected to said plurality of front end signal filtering devices and configured to output intermediate frequency signals corresponding to said plurality frequency bands in response to the input of said received radio frequency signals;

a first image reject mixer, residing in said signal down conversion device, configured to receive at least one of said plurality of RF signals in a GSM mode;

a second image reject mixer, residing in said signal down conversion device, configured to receive at least another one of said plurality of RF signals in a DCS mode and in a PCS mode;

a signal filtering and amplifying circuitry electrically connected to said signal down conversion device;

a signal demodulation device electrically connected to said signal filtering and amplifying circuitry and configured to output base band signals in response to the input of said intermediate frequency signals; and a frequency generating circuitry in electrical communications with said signal down conversion device and said signal demodulation device, and configured to provide a plurality of three or more operating frequencies corresponding to said plurality of frequency bands.

36. The circuit of claim 35 wherein said plurality of frequency bands comprises the GSM frequency band, the DCS 1800 frequency band, and the PCS 1900 frequency band.

37. The circuit of claim 35 wherein said frequency generating circuitry comprises:

a plurality of three or more voltage controlled oscillators configured to generate oscillating signals at radio frequencies corresponding to one of said plurality of frequency bands; and an intermediate frequency voltage controlled oscillator electrically coupled to said plurality of voltage controlled oscillators and configured to generate oscillating signals at intermediate frequencies corresponding to each of said plurality of frequency bands.

38. The circuit of claim 35 wherein said frequency generating circuitry comprises:

a voltage controlled oscillator configured to generate oscillating signals at radio frequencies corresponding to each of said plurality of frequency bands; and an intermediate frequency voltage controlled oscillator electrically coupled to said voltage controlled oscillator and configured to generate oscillating signals at intermediate frequencies corresponding to each of said plurality of frequency bands.

39. The circuit of claim 35 wherein said signal filtering and amplifying circuitry comprises:

a first signal filtering device electrically connected to said signal down conversion device and configured to filter out undesired components of said intermediate frequency signals;

a first signal amplifying device electrically connected to said first signal filtering device and configured to selectively amplify said intermediate frequency signals;

a second signal filtering device electrically connected to said first signal amplifying device; and a second signal amplifying device electrically connected to said second signal filtering device and configured to selectively amplify said intermediate frequency signals, wherein said second signal filtering device is configured to limit the bandwidth of said first and second amplifying devices and to impede undesired oscillation of said intermediate frequency signals.

40. A multi-band cellular telephone circuit, comprising:

a single IF VCO tunable to at least a first frequency corresponding to a radio frequency (RF) signal in a GSM mode, a second frequency corresponding to a RF signal in a DCS mode, and a third frequency corresponding to a RF signal in a PCS mode; and at least one divider connected to an output of said IF VCO for generating an IF frequency signal for a modulator, an IF frequency signal for a demodulator and a phase lock loop feedback signal for a dual phase lock loop (PLL).

41. The circuit of claim 40 further comprising:

the modulator connected to a first divider;

the demodulator connected to a second divider; and the dual phase lock loop (PLL) connected to a third divider, wherein the first divider, the second divider and the third divider are connected to the single IF VCO.

42. A method of processing GSM mode, DCS mode and PCS mode radio frequency (RF) signals comprising the steps of:

selectively tuning a single IF VCO to a first frequency corresponding to the GSM mode RF signal, a second frequency corresponding to the DCS mode RF signal, and a third frequency corresponding to the PCS mode RF signal;

dividing an output signal of the single IF VCO and providing the divided output signal to a modulator;

dividing the output signal of the single IF VCO and providing the divided output signal to a demodulator;

dividing the output signal of the single IF VCO and providing the divided output signal to a dual phase lock loop (PLL).

43. The method of claim 42, further comprising the steps of:

selectively tuning the single IF. VCO to the first frequency when a received RF signal is in the GSM mode;

selectively tuning the single IF VCO to the second frequency when the received RF signal is in the DCS mode; and selectively tuning the single IF VCO to the third frequency when the received RF signal is in the PCS mode.

44. The method of claim 42, further comprising the steps of:

selectively tuning the single IF VCO to the first frequency when a transmitted RF signal is in the GSM mode;

selectively tuning the single IF VCO to the second frequency when the transmitted RF signal is in the DCS mode; and selectively tuning the single IF VCO to the third frequency when the transmitted RF signal is in the PCS mode.

* * * * *